April 24, 1951 B. SALZBERG 2,549,855
MODULATION
Filed Nov. 14, 1945 2 Sheets-Sheet 1
FIG. 1
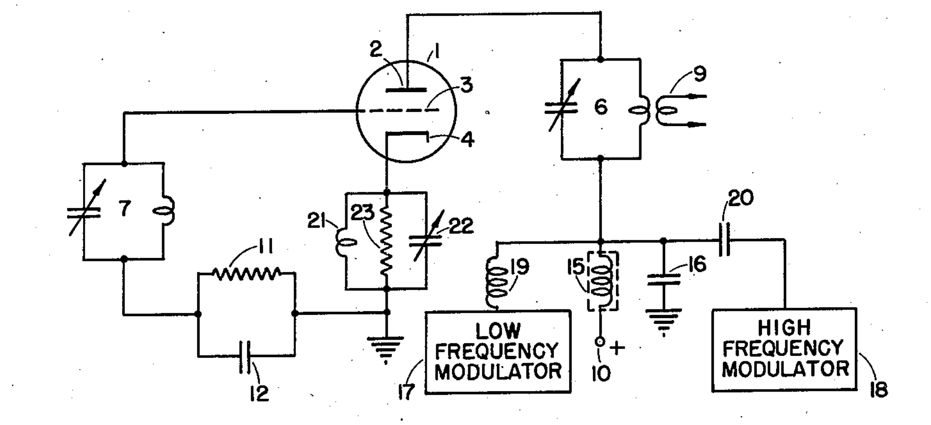
FIG. 2
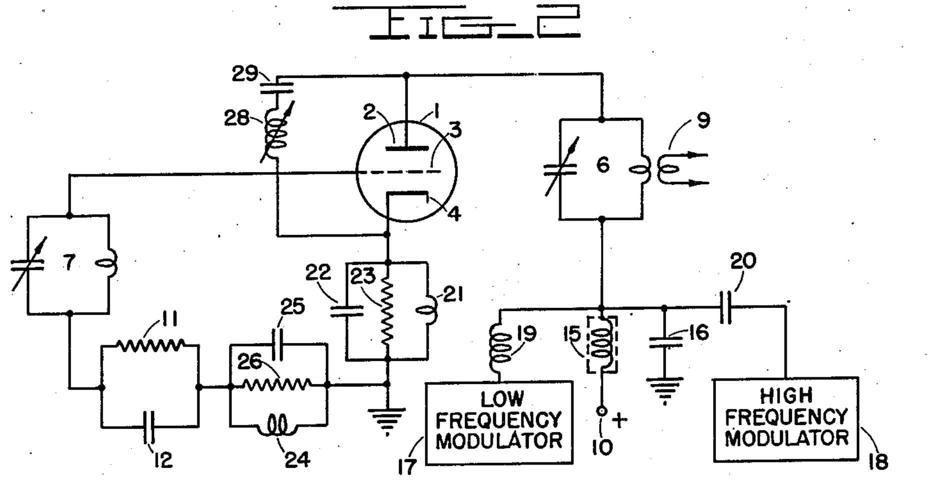
FIG. 6
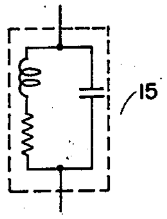
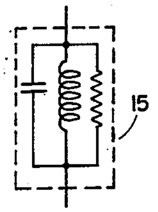
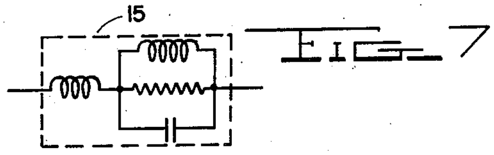
FIG. 5
Inventor
BERNARD SALZBERG
By Ralph L. Chappell
Attorney Inventor
BERNARD SALZBERG By Ralph L. Chappell
Attorney Patented Apr. 24, 1951 2,549,855

UNITED STATES PATENT OFFICE 2,549,855

MODULATION

Bernard Salzberg, Washington, D. C.

Application November 14, 1945, Serial No. 628,640

13 Claims. (Cl. 332—31)

Figure 3:
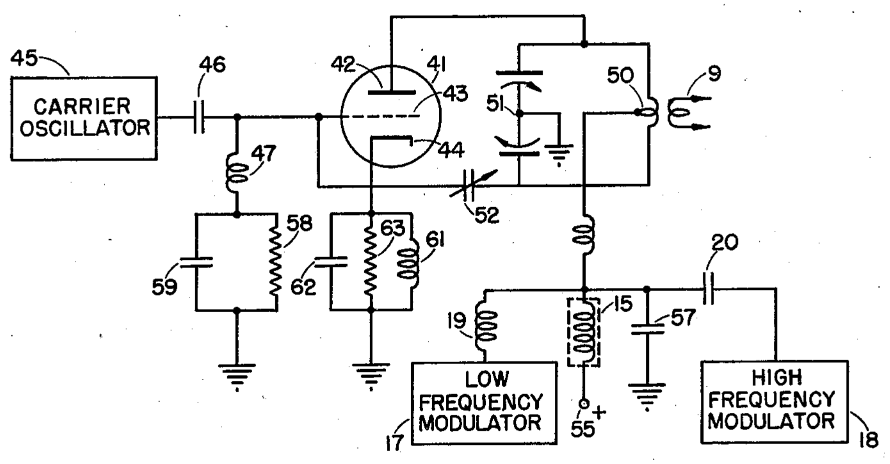

(Granted under the act of March 3, 1883, as amended April 30, 1928; 370 O. G. 757)

This invention relates to the modulation of radio frequency voltages, and is particularly directed to the problem of modulating a very high frequency voltage wave with another voltage of frequency which, while lower than the carrier frequency, lies within the band of high frequencies commonly employed as carriers in radio transmisison circuits.

The invention also comprehends the modulation of a very high frequency carrier with modulating frequencies extending from low audio voltages up to relatively high frequencies such as are used in radio communication.

In numerous applications it is necessary to modulate carrier frequency voltages with modulating frequencies extending into the relatively high radio frequency band. For high quality television broadcasting, for instance, modulation components up to a frequency of 10 or 15 megacycles may be required in the composite signal to be radiated. In other applications, it may be desirable to employ modulating frequencies as high as 30 megacycles or more.

Known methods of effecting modulation have been found inoperative when high frequencies such as the latter mentioned figure are used. At conventional low modulating frequencies, such as those which make up a speech wave, plate modulation of an oscillator or amplifier may be satisfactorily effected. With higher modulating frequencies, however, attempts to obtain a substantial percentage modulation renders the conventional oscillator or amplifier circuit inoperative. The present invention provides means for effecting high frequency modulation.

It is accordingly an object of the invention to modulate a carrier with a very high frequency wave.

It is another object of the invention to modulate a carrier with a plurality of components including audio frequency voltages and high radio frequency voltages.

Another object of the invention is to provide a modulated oscillator for generating a carrier modulated with a very high frequency voltage.

A further object of the invention is to provide a modulated amplifier which will be effective when very high frequency modulating voltages are applied.

Figure 4:
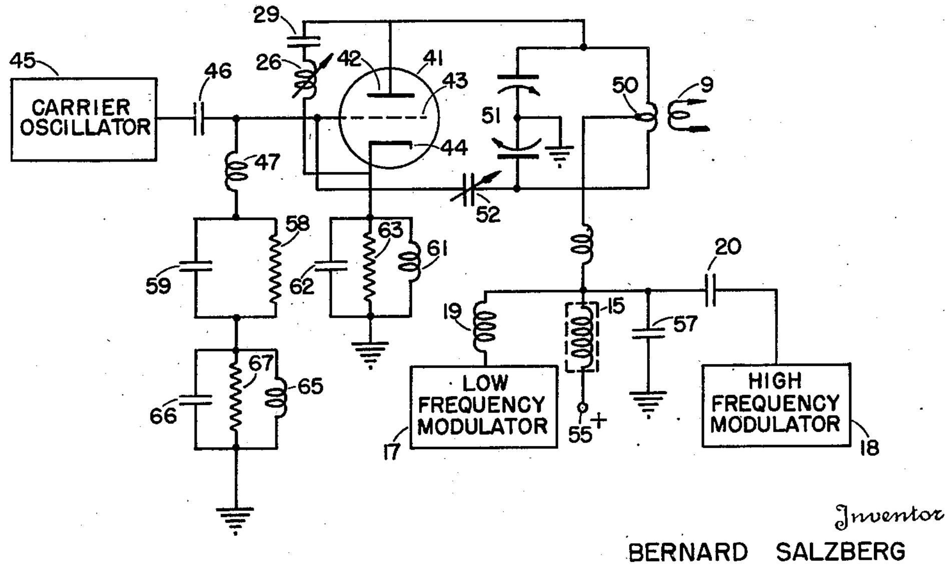

Whereas the invention may be applied to plate modulation of such vacuum tube circuits as common-grid, common-plate, or common-cathode oscillators or amplifiers, for the purpose of illustration it will be described in connection with the exemplary embodiments shown in the drawings, in which:

Fig. 1 discloses a modulated oscillator of the common-cathode type,

Fig. 2 discloses another modulated oscillator of the common-cathode type,

Fig. 3 discloses a modulated amplifier of the common-cathode type,

Fig. 4 discloses another modulated amplifier of the common-cathode type, and

Figs. 5, 6 and 7 show networks suitable for use in the circuits of Figs. 1 to 4.

The circuit of Fig. 1 comprises a modulated oscillator of the common-cathode type. This includes a vacuum tube, shown as a triode 1 provided with anode 2, control grid 3, and cathode 4. Cathode 4 may be indirectly heated, and the heating element is not shown in the figure.

The triode is connected in an oscillator circuit which comprises a plate tank 6 and a grid tank 7. Oscillation is effected through the distributed grid-anode capacitance within tube 1.

In the specific oscillator circuit shown, anode 2 is energized in series through tuned circuit 6 from a positive source of potential 10. Grid 3 is returned to ground through biasing resistor 11 which is shunted by by-pass capacitor 12. Power output for radiation or other purposes may be taken from coupling coil 9.

The circuit components described are effective in producing oscillations at the carrier frequency. In order to effect modulation, an impedance 15, across which the modulating potential may be developed, is connected between the source of positive potential 10 and the plate tank circuit 6. Impedance 15 in series with the D.-C. voltage supply 10 is shunted with by-pass capacitor 16 which, while offering a very low impedance to the carrier frequency, nevertheless offers a substantial impedance to all modulating frequencies.

A simple inductance as shown in Fig. 1 at 15 would be ineffective at very high modulating frequencies because of its distributed capacitance. If it is desired to modulate with a band of frequencies from low audio to relatively high radio frequencies, a video type circuit may be employed as shown in Fig. 3.

If it is desired to modulate with a relatively narrow band of radio frequencies, the circuit of Fig. 4 may be used. An arrangement for audio and a band of radio modulating frequencies is shown in Fig. 5.

In the circuit shown two sources of modulating potential are supplied. A low frequency modulator 17 is provided, and a high frequency modulator 18. Both modulators feed the anode circuit of the oscillator with voltages developed across the anode impedance 15. The high modulating frequency components are decoupled from the low frequency modulator by a series inductance 19. This inductance offers a very high impedance both to the carrier and the high frequency modulating components, but low impedance to the low frequency modulating components. The high frequency modulator is coupled through capacitor 20 which offers a high impedance to the lower modulating frequencies supplied by 17.

The oscillator circuit as thus far described is conventional. It is, however, impossible to obtain a substantial percentage of modulation of the carrier wave generated in this circuit through the action of the high frequency modulator 18 when the latter is supplying high frequency components such as of the order of 30 megacycles. When high percentage modulation is attempted, the oscillator becomes inoperative even though the tank circuits 6 and 7 are deliberately broadened in frequency response to prevent sideband frequency trimming. Through the action of the novel components incorporated according to the present invention, however, high modulation percentage may be easily obtained.

It has been ascertained that the failure of the conventional circuit arrangement is due to the fact that with high modulating frequencies the oscillator grid bias cannot vary during the modulation cycle since the grid circuit components offer substantially no impedance to the modulating frequencies. Proper grid bias variation during the high frequency modulation cycle is obtained through the incorporation in the cathode return circuit of a component offering a substantial impedance to the modulation frequency for establishing the correct operating grid bias over the modulation cycle. In the circuit of Fig. 1 a frequency selective network is shown which offers very low impedance to the carrier frequency and a higher impedance to the frequency components supplied by modulation generator 18. The network referred to includes inductance 21 in parallel with capacitor 22 adjusted for anti-resonance at the high modulation frequencies. The anti-resonant components are shunted by resistor 23 which acts to lower the impedance offered by the network to the modulation frequencies and by its variation will permit the selection of the desired impedance, and further broadens the band at which the network is operative. Thus an equally wide band width may be covered by the high frequency modulator 18.

The circuit operates to maintain proper grid bias through the variations in the high frequency modulation current components present in the anode circuit. The anti-resonant network produces a resulting variation in potential between ground and cathode 4 which is effective to bias grid 3 negative with respect to cathode 4 on the modulation peaks, thus maintaining proper grid bias throughout the modulation cycle.

Proper bias with respect to the low frequency modulation current cycle is obtained through the action of the resistance-capacitance network in the grid return circuit itself.

A further application of the invention is shown in the modulated oscillator circuit of Fig. 2. This circuit includes the components of that of Fig. 1, and incorporates additionally a network in the grid return circuit which is anti-resonant at the high modulation frequency. This circuit comprises an inductance 24, in parallel with a capacitor 25 and shunted by resistor 26. This network, in common with the one described in the cathode return circuit, offers a substantial impedance to frequencies supplied by the high frequency modulator, but offers substantially no impedance to the carrier frequency.

In the circuit of Fig. 2, grid bias variation may be directly obtained through the variation of the grid circuit high frequency modulation current component in the anti-resonant network. This network permits greater latitude in designing the cathode return network than is permissible in the circuit of Fig. 1, as it offers a further control over the grid bias.

With conventional tubes such as the triode shown n Fig. 2, however, it has been found that incorporation of the anti-resonant network in the grid return circuit may be insufficient in itself to permit high percentage modulation of the carrier generated by the oscillator, where a substantial capacitance exists between the grid and anode of tube 1. At high modulation frequencies the grid drive established through the grid-anode capacitance is sufficient to overcome the effect of the normal grid current resulting from electron flow to the grid, and establishes a grid bias variation of high amplitude and phase inverse to that requisite for proper oscillator operation.

In the circuit of Fig. 2, therefore, the anti-resonant cathode return network is employed in order to eliminate the grid-cathode drive which otherwise would result from the distributed grid-anode capacitance at the high modulation frequency. Consequently resistance 23 of Fig. 2 will be adjusted to effect a lower impedance at the high modulation frequency than is present in the corresponding network shown in the circuit of Fig. 1.

The cathode voltage variation relative to ground at the high modulation frequencies is sufficient to maintain a substantially constant cathode potential with respect to grid 3, whose potential is simultaneously varying at substantially the same phase and frequency through the coupling effected by the distributed grid-anode capacitance. This permits the anti-resonant network incorporated in the grid return circuit to establish the proper grid bias variation which is necessary during the high frequency modulation cycle.

In the application of the invention it is necessary that the proper phase relations exist in the high frequency modulation current. Whereas normally the cathode current is in phase with the modulation frequency voltage on the plate, under certain circumstances and with certain tubes it may be that the anode-cathode capacitance is sufficient to cause an appreciable advance in phase of the cathode current with respect to the anode voltage. This would result in an advance in the phase of the voltage developed across the cathode anti-resonant network. Where this is the case, it is desirable that the effect of the anode cathode capacitance be eliminated in order to obtain satisfactory operating conditions. This may be done by anti-resonating this capacitance at the high modulation frequencies. As an example of this type of circuit, an inductance in series with a blocking capacitor is shown in Fig. 2. Inductance 28 is adjusted for parallel resonance at the high modulation frequency with the cathode-anode capacitance of tube 1. Blocking capacitor 29 constitutes substantially a by-pass to the high modulating frequency potential.

The embodiment of the invention shown in Fig. 3 illustrates the application thereof to a modulated amplifier. The circuit includes a triode 41 having anode 42, grid 43 and indirectly heated cathode 44. Excitation is obtained from a source of carrier frequency voltage, shown as a carrier oscillator 45. In the example, the carrier oscillator is coupled to the grid through capacitor 46 and the grid drive is developed across a carrier frequency inductance 47 connected in series within grid return circuit.

The plate tank circuit includes inductance 50 and balanced condenser 51. Grid neutralization is obtained at carrier frequency through an adjustable condenser 52.

In this circuit the anode potential is supplied from source 55 and is fed through series inductance 15. The latter is by-passed to ground at the carrier frequency through capacitor 57, which offers low impedance to the carrier frequency, and high impedance to the modulating frequency components.

As in Fig. 1, high frequency modulating components are supplied by modulator 18, and low frequency modulation is supplied from modulator 17.

The grid return circuit includes a series resistance 58 shunted by capacitor 59. The latter constitutes a substantial by-pass to the carrier and high modulation frequencies. The cathode circuit includes a broadly tuned anti-resonant network comprising inductance 61, capacitance 62, and resistance 63, the network being resistive at the high modulation frequency but offering substantially no impedance to the carrier frequency.

The type of operation of the circuit of Fig. 3 is dependent upon the values of the grid circuit parameters. These comprise choke 47 in series with a grid biasing resistor 58. Resistor 58 is by-passed with capacitor 59.

When these components offer low impedance to the high modulation frequencies, the circuit operates in accordance with the principles of the circuit of Fig. 1. Whereas it is requisite for effecting grid excitation that a relatively high impedance be offered the carrier frequency, the grid circuit impedance at the high modulating frequencies may be fixed as desired, with this limitation, by the value of inductance 47. In the embodiment of Fig. 3, this inductance offers low impedance at these modulation frequencies. Capacitor 59 constitutes a by-pass to the high modulation frequencies. The low capacitative grid-anode impedance at such frequencies is therefore ineffective to establish a resulting voltage variation of the grid.

The operation of this circuit in respect to the maintenance of proper grid bias during the modulation frequency cycle is substantially identical with that of Fig. 1. The variations in cathode current accompanying the high frequency modulation effectively establish a grid biasing potential at this frequency of the correct phase so that high percentage modulation may be effected by modulator 18.

The circuit of Fig. 4 constitutes a modulated amplifier, operating by employment of the grid circuit high modulating frequency current component to establish the proper bias during the modulation frequency cycle. The circuit differs from that of Fig. 3 in incorporating a broadly tuned anti-resonant network in the grid return. This network comprises inductance 65, capacitor 66, and resistor 67, and permits a wider range of design choice of the cathode return network parameters.

As in the operation of the oscillator in Fig. 2, the circuit of Fig. 4 comprises distributed grid-anode capacitance effectively applying a high voltage drive on the grid at the high modulating frequencies. The resulting grid-cathode voltage phase component is counteracted by the anti-resonant network incorporated in the cathode return circuit and comprising inductance 61, condenser 62 and resistance 63. This permits the anti-resonant network in the grid return circuit to control the grid cathode bias through the high modulating frequency phase components resulting from electron flow to the grid itself. Consequently proper operating conditions are established in the amplifier.

As in Fig. 2, the cathode-anode capacitance effect may be eliminated by inductance 28 connected from cathode 44 through blocking capacitor 29 to anode 42.

It will be understood that the embodiments described are exemplary only, and that the scope of the invention is to be determined with respect to the appended claims.

The invention described herein may be manufactured and used by or for the Government of the United States of America for governmental purposes without the payment of any royalties thereon or therefor.

What is claimed is:

1. A modulation circuit comprising a vacuum tube having a control grid, an anode, and a cathode, means for applying a carrier frequency voltage between the control grid and cathode, modulating means for applying a high frequency voltage to the anode, and impedance means parallel resonant at the high modulation frequency connected in common between the cathode and grid and cathode and anode operative to establish a cathode voltage variation at the high modulation frequency.

2. A modulated oscillator comprising a vacuum tube having a control grid, an anode, and a cathode, circuit means connecting with the grid and anode to establish oscillation, modulating means for applying a high frequency voltage to the anode, and impedance means parallel resonant at the high modulation frequency connected in common between the cathode and grid and cathode and anode operative to establish a cathode voltage variation at the high modulation frequency.

3. A modulated amplifier comprising a vacuum tube having a control grid, an anode, and a cathode, means for applying a carrier frequency voltage between the control grid and cathode, modulating means for applying a high frequency voltage to the anode, and impedance means parallel resonant at the high modulation frequency connected in common between the grid and cathode operative to establish a cathode voltage variation at the high modulation frequency.

4. A modulation circuit comprising a vacuum tube having a control grid, an anode, and a cathode, means for applying a carrier frequency voltage between the control grid and cathode, modulating means for applying an audio frequency modulation voltage to the anode, modulating means for applying a high frequency voltage on the anode, and impedance means connected in common between the cathode and grid and cathode and anode operative to establish a cathode voltage variation at the high modulation frequency.

5. A modulated oscillator comprising a vacuum tube having a control grid, an anode, and a cathode, circuit means connecting with the grid and anode to establish oscillation, modulating means for applying an audio frequency modulation voltage to the anode, modulating means for applying a high frequency voltage to the anode, and impedance means connected in common between the cathode and grid and cathode and anode operative to establish a cathode voltage variation at the high modulation frequency.

6. A modulated amplifier comprising a vacuum tube having a control grid, an anode, and a cathode, means for applying a carrier frequency voltage between the control grid and cathode, modulating means for applying an audio frequency modulation voltage to the anode, modulating means for applying a high frequency voltage to the anode, and impedance means connected in common between the cathode and grid and anode operative to establish a cathode voltage variation at the high modulation frequency.

7. A modulation circuit comprising a vacuum tube having a control grid, an anode, said electrodes having distributed capacitance therebetween, and a cathode, means for applying a carrier frequency voltage between the control grid and cathode, modulating means for applying a high frequency voltage to the anode, circuit means connected between the grid and the cathode circuit presenting a high impedance to the high modulating frequency, and impedance means parallel resonant at the high modulation frequency connected in common between cathode and grid and cathode and anode operative to counteract the high frequency grid-cathode modulation voltage drive effected by the distributed capacitance.

8. A modulated oscillator comprising a vacuum tube having a control grid, an anode, said electrodes having distributed capacitance therebetween, and a cathode, circuit means connecting with the grid and anode to establish oscillation, modulating means for applying a high frequency voltage to the anode, circuit means connected between the grid and the cathode circuit presenting a high impedance to the high modulating frequency, and impedance means parallel resonant at the high modulation frequency connected in common between cathode and grid and cathode and anode operative to counteract the grid-cathode modulation frequency voltage drive effected by the distributed capacitance.

9. A modulated amplifier comprising a vacuum tube having a control grid, an anode, said electrodes having distributed capacitance therebetween, and a cathode, means for applying a carrier frequency voltage between the control grid and cathode, modulating means for applying a high frequency voltage to the anode, circuit means connected between the grid and the cathode circuit presenting a high impedance to the high modulating frequency, and impedance means parallel resonant at the high modulation frequency connected between the cathode and grid and cathode and anode operative to counteract the high frequency grid-cathode modulation voltage drive effected by the distributed capacitance.

10. A modulation circuit comprising a vacuum tube having a control grid, an anode, said electrodes having distributed capacitance therebetween, and a cathode, means for applying a carrier frequency voltage between the control grid and cathode, means for applying an audio frequency modulation voltage to the anode, modulating means for applying a high frequency voltage to the anode, circuit means connected between the grid and the cathode presenting a high impedance to the high modulating frequency, and impedance means connected in common between cathode and grid and cathode and anode operative to counteract the high frequency grid-cathode modulation voltage drive effected by the distributed capacitance.

11. A modulated oscillator comprising a vacuum tube having a control grid, an anode, said electrodes having distributed capacitance therebetween, and a cathode, circuit means connecting with the grid and anode to establish oscillation, modulating means for applying an audio frequency voltage to the anode, modulating means for applying a high frequency voltage to the anode, circuit means connected between the grid and the cathode presenting a high impedance to the high modulating frequency, and impedance means connected in common between cathode and grid and cathode and anode operative to counteract the high frequency grid-cathode modulation voltage drive effected by the distributed capacitance.

12. A modulated amplifier comprising a vacuum tube having a control grid, an anode, said electrodes having distributed capacitance therebetween, and a cathode, means for applying a carrier frequency voltage between the control grid and cathode, modulating means for applying an audio frequency modulation voltage on the anode, modulating means for applying a high frequency voltage to the anode, circuit means connected between the grid and the cathode presenting a high impedance to the high modulating frequency, and impedance means connected in common between cathode and grid and cathode and anode operative to counteract the high frequency grid-cathode modulation voltage drive effected by the distributed capacitance.

13. A modulation circuit comprising a vacuum tube having a control grid, an anode, and a cathode, said anode and cathode having distributed capacitance therebetween, means for applying a carrier frequency voltage between the control grid and cathode, modulating means for applying a high frequency voltage to the anode, inductive means connected between the anode and cathode operative to anti-resonate said distributed capacity at the high modulation frequency, and impedance means connected in common between the cathode and grid and cathode and anode operative to establish a cathode voltage variation at the high modulation frequency.

BERNARD SALZBERG.

REFERENCES CITED

The following references are of record in the file of this patent:

UNITED STATES PATENTS

| Number | Name | Date |
|---|---|---|
| 1,558,909 | Nichols | Oct. 27, 1925 |
| 1,603,282 | Heising | Oct. 19, 1926 |
| 2,003,285 | Ditcham | June 4, 1935 |
| 2,280,605 | Roberts | Apr. 21, 1942 |

FOREIGN PATENTS

| Number | Country | Date |
|---|---|---|
| 435,302 | Great Britain | Sept. 18, 1935 |